US011862745B2

(12) United States Patent
Sewell et al.

(10) Patent No.: US 11,862,745 B2
(45) Date of Patent: *Jan. 2, 2024

(54) ONE-DIMENSIONAL METALLIZATION FOR SOLAR CELLS (71) Applicant: Maxeon Solar Pte. Ltd., Singapore (SG)

(72) Inventors: Richard Hamilton Sewell, Los Altos, CA (US); David Fredric Joel Kavulak, Fremont, CA (US); Lewis Abra, San Francisco, CA (US); Thomas P. Pass, San Jose, CA (US); Taeseok Kim, Pleasanton, CA (US); Matthieu Moors, Braine-le-Chateau (BE); Benjamin Ian Hsia, Fremont, CA (US); Gabriel Harley, Mountain View, CA (US)

(73) Assignee: Maxeon Solar Pte. Ltd., Singapore (SG)

(*) Notice: Subject to any disclaimer, the term of this patent is extended or adjusted under 35 U.S.C. 154(b) by 9 days.

This patent is subject to a terminal disclaimer.

(21) Appl. No.: 16/741,591

(22) Filed: Jan. 13, 2020

(65) Prior Publication Data

US 2020/0152813 A1 May 14, 2020

Related U.S. Application Data (63) Continuation of application No. 14/750,821, filed on Jun. 25, 2015, now Pat. No. 10,535,790.

(51) Int. Cl.
*H01L 31/05* (2014.01)
*H01L 31/0224* (2006.01)
*H01L 31/068* (2012.01)

(52) U.S. Cl.
CPC .. *H01L 31/0516* (2013.01); *H01L 31/022441* (2013.01); *H01L 31/022458* (2013.01);
(Continued)

(58) Field of Classification Search
CPC ..... H01L 31/022441; H01L 31/022458; H01L 31/05; H01L 31/0504; H01L 31/0508; H01L 31/0516
See application file for complete search history.

(56) References Cited

U.S. PATENT DOCUMENTS 4,380,112 A 4/1983 Little
9,640,710 B2 5/2017 Pearce et al.
(Continued)

FOREIGN PATENT DOCUMENTS

CN 103035779 4/2013
CN 103107210 5/2013
(Continued)

OTHER PUBLICATIONS

English machine translation of WO 2013/018533A1. (Year: 2013).*
(Continued)

*Primary Examiner* — Lindsey A Buck
(74) *Attorney, Agent, or Firm* — Schwabe, Williamson & Wyatt, P.C.

(57) ABSTRACT

Approaches for fabricating one-dimensional metallization for solar cells, and the resulting solar cells, are described. In an example, a solar cell includes a substrate having a back surface and an opposing light-receiving surface. A plurality of alternating N-type and P-type semiconductor regions is disposed in or above the back surface of the substrate and parallel along a first direction to form a one-dimensional layout of emitter regions for the solar cell. A conductive contact structure is disposed on the plurality of alternating N-type and P-type semiconductor regions. The conductive contact structure includes a plurality of metal lines corresponding to the plurality of alternating N-type and P-type semiconductor regions. The plurality of metal lines is par-
(Continued)

allel along the first direction to form a one-dimensional layout of a metallization layer for the solar cell.

16 Claims, 5 Drawing Sheets

(52) U.S. Cl.
CPC .......... *H01L 31/05* (2013.01); *H01L 31/0504* (2013.01); *H01L 31/0508* (2013.01); *H01L 31/0682* (2013.01); *Y02E 10/50* (2013.01); *Y02E 10/546* (2013.01); *Y02E 10/547* (2013.01)

(56) References Cited

U.S. PATENT DOCUMENTS

| | | | |
|---|---|---|---|
| 10,535,790 B2 * | 1/2020 | Sewell | H01L 31/0508 |
| 2004/0200520 A1 | 10/2004 | Mulligan et al. | |
| 2008/0216887 A1 * | 9/2008 | Hacke | H01L 31/0516 136/244 |
| 2008/0223437 A1 | 9/2008 | De Ceuster | |
| 2009/0183759 A1 | 7/2009 | Hishida | |
| 2010/0024881 A1 | 2/2010 | Hacke et al. | |
| 2010/0144218 A1 * | 6/2010 | Rose | H01L 31/0516 439/883 |
| 2010/0200058 A1 | 8/2010 | Funakoshi | |
| 2011/0214714 A1 | 9/2011 | Aberle et al. | |
| 2012/0103415 A1 * | 5/2012 | Sainoo | H01L 31/0516 136/256 |
| 2012/0204938 A1 | 8/2012 | Hacke et al. | |
| 2012/0244284 A1 * | 9/2012 | Sanada | B05C 5/0216 427/256 |
| 2013/0081674 A1 * | 4/2013 | Joe | H01L 31/0516 136/251 |
| 2013/0081675 A1 | 4/2013 | Joe et al. | |
| 2013/0160825 A1 | 6/2013 | Lantzer et al. | |
| 2013/0206221 A1 | 8/2013 | Gannon et al. | |
| 2014/0158192 A1 * | 6/2014 | Cudzinovic | H01L 31/0682 136/256 |
| 2015/0068592 A1 | 3/2015 | Kommera et al. | |

FOREIGN PATENT DOCUMENTS

| | | | |
|---|---|---|---|
| CN | 103280465 | 9/2013 | |
| CN | 104037249 | 9/2014 | |
| DE | 10020412 | 11/2001 | |
| JP | 2011-176010 | 9/2011 | |
| KR | 10-2012-0031088 | 3/2012 | |
| KR | 10-2013-0034867 | 4/2013 | |
| WO | WO-2013018533 A1 * | 2/2013 | ......... H01L 31/0508 |

OTHER PUBLICATIONS

First Action Interview Pilot Program Pre-Interview Communication from U.S. Appl. No. 14/750,821 dated Feb. 4, 2016, 5 pgs.
Gress, et al., "Wire bonding as a cell interconnection technique for polycrystalline silicon thin-film solar cells on glass," Progress in Photovoltaics: Research and Applications, Mar. 11, 2010, pp. 221-228, vol. 18.
First Action Interview Office Action from U.S. Appl. No. 14/750,821 dated Apr. 26, 2016, 6 pgs.
International Search Report and Written Opinion for PCT Patent Application No. PCT/US16/38579 dated Sep. 29, 2016, 14 pgs.
Final Office Action from U.S. Appl. No. 14/750,821 dated Oct. 6, 2016, 23 pgs.
Non Final Office Action from U.S. Appl. No. 14/750,821 dated Jun. 20, 2017, 11 pgs.
Final Office Action from U.S. Appl. No. 14/750,821 dated Oct. 11, 2017, 13 pgs.
International Prelminary Report on Patentability from PCT/US2016/038579 dated Jan. 4, 2018, 11 pgs.
Non Final Office Action from U.S. Appl. No. 14/750,821 dated Jun. 27, 2018, 14 pgs.
Final Office Action from U.S. Appl. No. 14/750,821 dated Feb. 1, 2019, 13 pgs.
First Office Action from Chinese Patent Application No. 2016800373061 dated Nov. 4, 2019, 13 pgs.
Third Office Action from Chinese Patent Application No. 2016800373061 dated Feb. 1, 2021, 6 pgs.
Second Office Action from Chinese Patent Application No. 2016800373061 dated Jul. 2, 2020, 14 pgs.
Office Action from Taiwanese Patent Application No. 105120088 dated Feb. 21, 2020, 14 pgs.
Office Action from Korean Patent Application No. 10-2018-7001951 dated May 22, 2023, 6 pgs.

* cited by examiner

ONE-DIMENSIONAL METALLIZATION FOR SOLAR CELLS

CROSS-REFERENCE TO RELATED APPLICATIONS

This application is a continuation of U.S. patent application Ser. No. 14/750,821, filed on Jun. 25, 2015, the entire contents of which are hereby incorporated by reference herein.

TECHNICAL FIELD

Embodiments of the present disclosure are in the field of renewable energy and, in particular, include approaches for fabricating one-dimensional metallization for solar cells, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Approaches for fabricating one-dimensional metallization for solar cells, and the resulting solar cells, are described herein. In the following description, numerous specific details are set forth, such as specific paste compositions and process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes a substrate having a back surface and an opposing light-receiving surface. A plurality of alternating N-type and P-type semiconductor regions is disposed in or above the back surface of the substrate and parallel along a first direction to form a one-dimensional layout of emitter regions for the solar cell. A conductive contact structure is disposed on the plurality of alternating N-type and P-type semiconductor regions. The conductive contact structure includes a plurality of metal lines corresponding to the plurality of alternating N-type and P-type semiconductor regions. The plurality of metal lines is parallel along the first direction to form a one-dimensional layout of a metallization layer for the solar cell.

Also disclosed herein are photovoltaic assemblies. In one embodiment, a photovoltaic assembly includes first and second solar cells. Each of the first and second solar cells includes a substrate having a back surface and an opposing light-receiving surface. Each of the first and second solar cells also includes a plurality of alternating N-type and P-type semiconductor regions disposed in or above the back surface of the substrate and parallel along a first direction to form a one-dimensional layout of emitter regions for the solar cell. Each of the first and second solar cells also includes a conductive contact structure disposed on the plurality of alternating N-type and P-type semiconductor regions, the conductive contact structure including a plurality of metal lines corresponding to the plurality of alternating N-type and P-type semiconductor regions parallel along the first direction to form a one-dimensional layout of a metallization layer for the solar cell. Each of the plurality of metal lines terminates in a staggered fashion at first and second ends of the substrate. The photovoltaic assembly also includes an interconnect structure electrically coupling the first and second solar cells between the second end of the substrate of the first solar cell and the first end of the substrate of the second solar cell. The interconnect structure is disposed over and electrically contacts first alternating ones of the plurality of metal lines of the first solar cell. However, the interconnect structure is not disposed over second alternating ones of the plurality of metal lines of the first solar cell. The interconnect structure is also disposed over and electrically contacts first alternating ones of the plurality of metal lines of the second solar cell. However, the interconnect structure is not disposed over second alternating ones of the plurality of metal lines of the second solar cell.

In another embodiment, a photovoltaic assembly includes first and second solar cells. Each of the first and second solar cells includes a substrate having a back surface and an opposing light-receiving surface. Each of the first and second solar cells also includes a plurality of alternating N-type and P-type semiconductor regions disposed in or above the back surface of the substrate and parallel along a first direction to form a one-dimensional layout of emitter regions for the solar cell. Each of the first and second solar cells includes a conductive contact structure disposed on the plurality of alternating N-type and P-type semiconductor regions. The conductive contact structure includes a plurality of metal lines corresponding to the plurality of alternating N-type and P-type semiconductor regions parallel along the first direction to form a one-dimensional layout of a metallization layer for the solar cell. Each of the plurality of metal lines terminates in a parallel fashion at first and second ends of the substrate. The photovoltaic assembly also includes an interconnect structure electrically coupling the first and second solar cells between the second end of the substrate of the first solar cell and the first end of the substrate of the second solar cell. The interconnect structure is disposed over and electrically contacts first alternating ones of the plurality of metal lines of each of the first and second solar cells. The interconnect structure is also disposed over, but is not electrically contacting, second alternating ones of the plurality of metal lines of each of the first and second solar cells.

One or more embodiments described herein are directed to one dimensional cell metallization and interconnection structures. In an embodiment, an on-cell metallization pattern includes multiple parallel lines that are not connected together at the edges of the cell. Such a pattern may be referred to as "busless and padless" or "one-dimensional." In an embodiment, when implementing such a pattern, photocurrent collection losses associated with pad and bus areas of the cell can be eliminated. This can lead to increased conversion efficiency of the cell. Furthermore, in an embodiment, due to its elegant simplicity in design, a one-dimensional finger pattern enables certain cost effective and high throughput patterning methods for both emitter formation and on-cell metallization. Specific implementations that may benefit include those based on in-situ patterning with ion-implantation. Described in greater detail below are cell interconnect designs. Such one-dimensional on-cell metallization has the potential for higher efficiency, cost savings and improved reliability.

To provide context, in order to achieve ultimate cell conversion efficiencies, loss mechanisms must be minimized. One or more embodiments described herein involve approaches for minimizing photocurrent collection losses otherwise due to busbars and pads by moving the busbar function to an interconnect structure. The interconnect pads are distributed across all fingers such that each pad is, in effect, the same width as an individual finger. Such arrangements mitigate, or altogether eliminate, a compromise to cell performance otherwise associated with state-of-the-art solar cell configurations.

To provide further context, state-of-the-art approaches for metallizing a one-dimensional emitter include printing a patterned polyimide layer under a plating seed layer, in conjunction with a two-dimensional patterned plating mask which defines pads and bus bars on the cell. The polyimide layer prevents shorts as busbars and pads cross the opposite polarity emitters. However, it is not yet well understood if a polyimide based approach (e.g., polyimide as an inter-layer dielectric) will necessarily be compatible with next generation metal bonding methods (e.g., bonding methods based on thermo-compression bonding (TCB) and/or laser welding). The high temperature used in TCB (e.g., approximately 450 degrees Celsius) may degrade the polyimide significantly and create unacceptable outgas sing. Additionally, the topology introduced by the polyimide may hinder the application of uniform bonding pressure between a metal foil and an underlying wafer during TCB. For laser bonding, although it may not be necessary to laser weld a metal foil directly on top of the polyimide layer, the topology introduced by the polyimide layer may create additional challenges. Furthermore, if a polyimide print operation is avoidable by using a interconnect busbar, then an overall processing flow may be simplified.

In accordance with one or more embodiments of the present disclosure, a one-dimensional finger pattern is implemented for emitter formation. Such a one-dimensional finger pattern may be preferred since the arrangement can make use of a stationary mask/travelling wafer patterning scheme based on ion implantation. It is to be appreciated that a one-dimensional finger pattern may be the only way of effectively patterning with ion implantation. Accordingly, cell architectures described herein involve a cell metallization and interconnect fabrication approach compatible with a one-dimensional emitter.

Additional embodiments include the use of one dimensional finger patterning as a preferential approach for laser patterning operations, such as metallization patterning. For example, a one-dimensional finger pattern may be patterned via multiple beam-splitters and a one dimensional scanner system for higher throughput. One dimensional finger patterning may be implemented to enable a fabrication approach based on epoxy mask removal during etching. Furthermore, by providing a large number of distributed bond points, the failure of any single bond may have a minimal impact on the cell performance and current distribution. By contrast, in state-of-the-art interconnect approaches based on three bond points for each polarity, the failure of a single bond causes a significant redistribution of current in the cell and can lead to hot spots and cell failure.

Figure 1A:
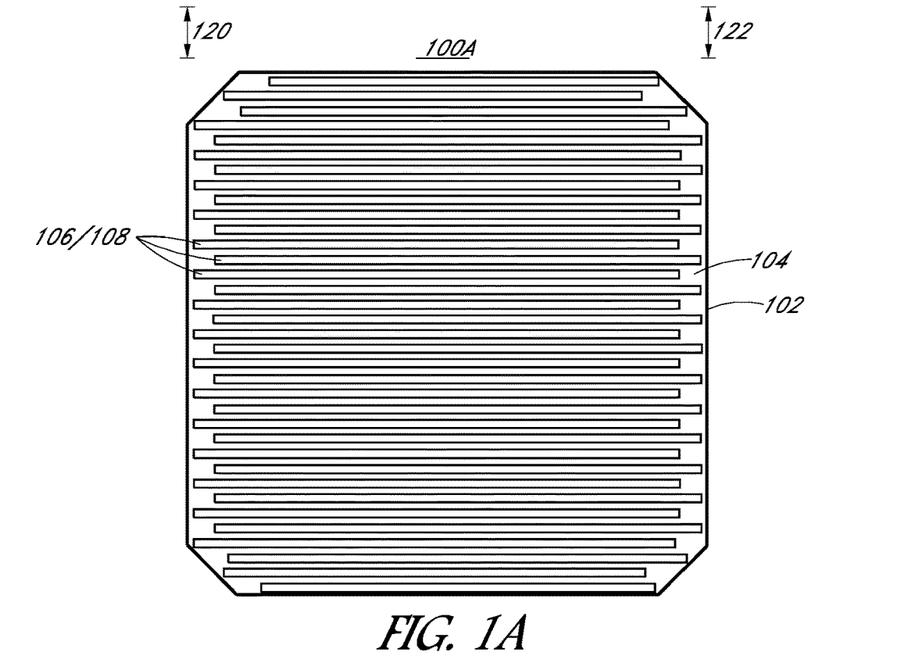
FIG. 1A illustrates a plan view of the back side of a solar cell, in accordance with an embodiment of the present disclosure.
Figure 1B:
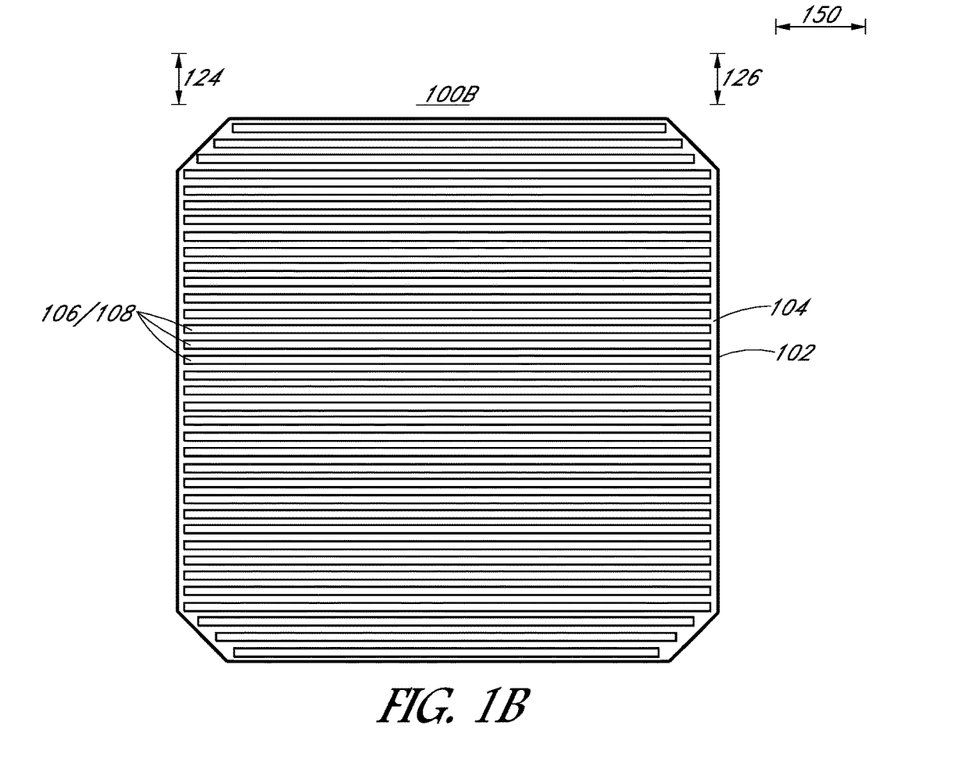
FIG. 1B illustrates a plan view of the back side of another solar cell, in accordance with another embodiment of the present disclosure.

As examples of one dimensional on-cell metallization patterns, FIGS. 1A and 1B illustrate plan views of the back side of solar cells, in accordance with an embodiment of the present disclosure.

Referring to FIGS. 1A and 1B, a solar cell 100A or 100B, respectively, includes a substrate 102 having a back surface 104 and an opposing light-receiving surface (not shown). A plurality of alternating N-type and P-type semiconductor regions 106 is disposed in or above the back surface 104 of the substrate 102 and parallel along a first direction 150 to form a one-dimensional layout of emitter regions for the solar cell 100A or 100B. The plurality of alternating N-type and P-type semiconductor regions may be referred to herein as fingers of alternating polarity. A conductive contact structure 108 is disposed on the plurality of alternating N-type and P-type semiconductor regions 106. The conductive contact structure 108 includes a plurality of metal lines corresponding to the plurality of alternating N-type and P-type semiconductor regions 106 (the conductive contact structure 108 and the plurality of alternating N-type and P-type semiconductor regions 106 are shown collectively as lines 106/108 in FIGS. 1A and 1B). The plurality of metal lines 108 is parallel along the first direction 150 to form a one-dimensional layout of a metallization layer for the solar cell 100A or 100B.

With reference only to FIG. 1A, in an embodiment, each of the plurality of metal lines 108 terminates in a staggered fashion at first 120 and second 122 ends of the substrate 102. With reference only to FIG. 1B, in another embodiment, each of the plurality of metal lines 108 terminates in a parallel fashion at first 124 and second 126 ends of the substrate 102.

In an embodiment, with reference again to both FIGS. 1A and 1B, the conductive contact structure 108 further includes a metal seed layer disposed between the plurality of alternating N-type and P-type semiconductor regions 106 and the plurality of metal lines 108. In an embodiment, the substrate 102 is a monocrystalline silicon substrate, and the plurality of alternating N-type and P-type semiconductor regions 106 is a plurality of N-type and P-type diffusion regions formed in the silicon substrate 102. In another embodiment, however, the plurality of alternating N-type and P-type semiconductor regions 106 is a plurality of N-type and P-type polycrystalline silicon regions formed above the back surface 104 of the substrate 102 (e.g., as polycrystalline silicon emitter regions formed on a dielectric layer formed on the back surface 104 of the substrate 102).

With reference again to FIG. 1A, in an embodiment, the staggered arrangement provides for one polarity (e.g., N-type or P-type) of fingers as slightly shortened. As described in greater detail below in association with FIGS. 2 and 3, this arrangement of FIG. 1A can be implemented such that one polarity of fingers not extend under an overlying interconnect formed thereon. In a specific embodiment, as described in greater detail below, the second polarity of fingers stops approximately one millimeter from the substrate 102 edge to provide clearance at the edge for a cloaking layer. With reference again to FIG. 1B, in an embodiment, the parallel terminating arrangement can be accommodated in other photovoltaic architectures, as is described in greater detail below in association with FIG. 4.

In a first implementation of the solar cells of the type of FIG. 1A, and as described in greater detail in association with FIG. 2 below, a cell interconnection geometry can be referred to as inter-layer dielectric free, "ILD free." On each side of the cell, one polarity of fingers is slightly shortened such that it does not extend under an overlying interconnect. Since the fingers need to be shortened, metal 1 (M1; e.g., seed layer) and metal 2 (M2; e.g., foil or electroplated conductive layer) patterning may involve some complexity. The overlying interconnect (M3; e.g., an overlying aluminum or copper sheet or the like) extends the full width of the cell, and is bonded to each finger of a same polarity. The opposite side of the interconnect is bonded to each finger of the opposite polarity on the next cell. By bonding the interconnect individually to each finger, on-cell bussing or pads may be omitted. It is to be appreciated that such an approach can require high accuracy of bonding points between the interconnect (M3) and the on-cell metallization M2. Specifically, bond points must be aligned with the M2 fingers. In an embodiment, such a level of accuracy is achieved using laser welding. The placement accuracy of the interconnect itself, however, is relaxed somewhat in comparison with other approaches since there is no ILD pattern on the interconnect that must be aligned with the M2 fingers.

In an embodiment, such an approach relies on a bottom anti-reflective coating (BARC) layer and a physical gap to insulate between the M3 and the opposite polarity emitter (assuming the emitter is continuous to the edge of the wafer). In one such embodiment, the approach is workable since the M3 does not penetrate into any underlying pinholes.

Figure 2:
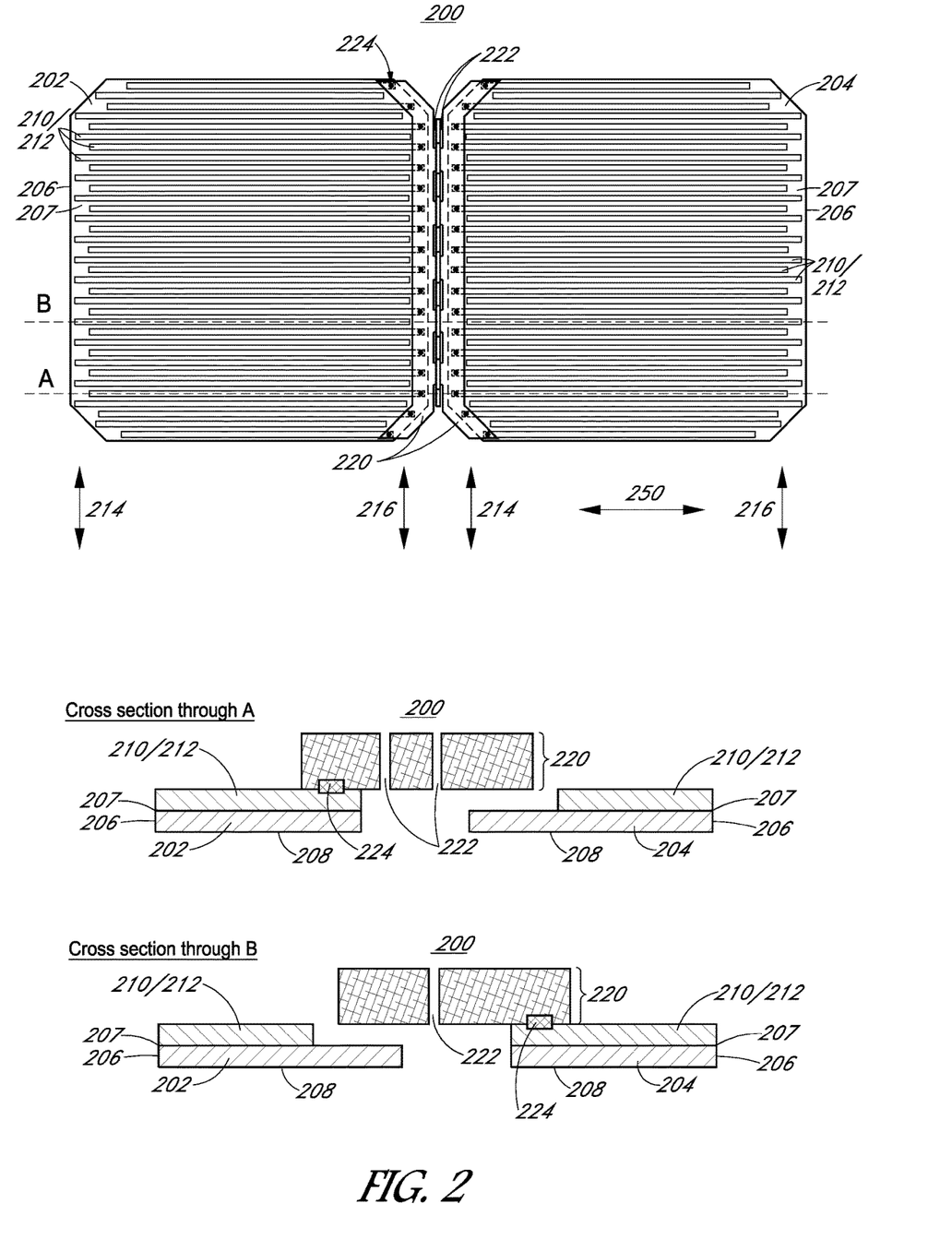
FIG. 2 illustrates a plan view and corresponding cross-sectional views of a photovoltaic assembly based on solar cells of the type of FIG. 1A, in accordance with an embodiment of the present disclosure.

As an example, FIG. 2 illustrates a plan view and corresponding cross-sectional views of a photovoltaic assembly based on solar cells of the type of FIG. 1A, in accordance with an embodiment of the present disclosure. Referring to FIG. 2, a photovoltaic assembly 200 includes first 202 and second 204 solar cells. Each of the first 202 and second 204 solar cells includes a substrate 206 having a back surface 207 and an opposing light-receiving surface 208. Each of the first 202 and second 204 solar cells also includes a plurality of alternating N-type and P-type semiconductor regions 210 disposed in or above the back surface 207 of the substrate 206 and parallel along a first direction 250 to form a one-dimensional layout of emitter regions for the solar cell 202 or 204. Each of the first 202 and second 204 solar cells also includes a conductive contact structure disposed on the plurality of alternating N-type and P-type semiconductor regions 210. The conductive contact structure includes a plurality of metal lines 212 corresponding to the plurality of alternating N-type and P-type semiconductor regions 210 parallel along the first direction 250 to form a one-dimensional layout of a metallization layer for the solar cell. Each of the plurality of metal lines 212 terminates in a staggered fashion at first 214 and second ends 216 of the substrate 206.

The photovoltaic assembly also 200 includes an interconnect structure 220 electrically coupling the first 202 and second 204 solar cells between the second end 216 of the substrate 206 of the first solar cell 204 and the first end 214 of the substrate 206 of the second solar cell 204. The interconnect structure 220 is disposed over and electrically contacts first alternating ones of the plurality of metal lines 212 of the first solar cell 202. However, the interconnect structure is not disposed over second alternating ones of the plurality of metal lines 212 of the first solar cell 202. The interconnect structure 220 is also disposed over and electrically contacts first alternating ones of the plurality of metal lines 212 of the second solar cell 204. However, the interconnect structure 220 is not disposed over second alternating ones of the plurality of metal lines 212 of the second solar cell 204.

As is depicted in FIG. 2, in an embodiment, the interconnect structure 220 includes one or more stress relief cuts 222 formed therein. As is also depicted in FIG. 2, in an embodiment, the interconnect structure 220 is bonded (e.g., soldered, welded, joined, glued, etc.) to each of the first alternating ones of the plurality of metal lines 212 of the first solar cell 202 and to each of the first alternating ones of the plurality of metal lines 212 of the second solar cell 204 (e.g., as is depicted by bond points 224).

In a second implementation of the solar cells of the type of FIG. 1A, and as described in greater detail in association with FIG. 3 below, a cell interconnection geometry can be referred to as "ILD free" with cloaking. As an example, FIG. 3 illustrates a plan view and corresponding cross-sectional views of a photovoltaic assembly based on solar cells of the type of FIG. 1A, in accordance with another embodiment of the present disclosure.

Figure 3:
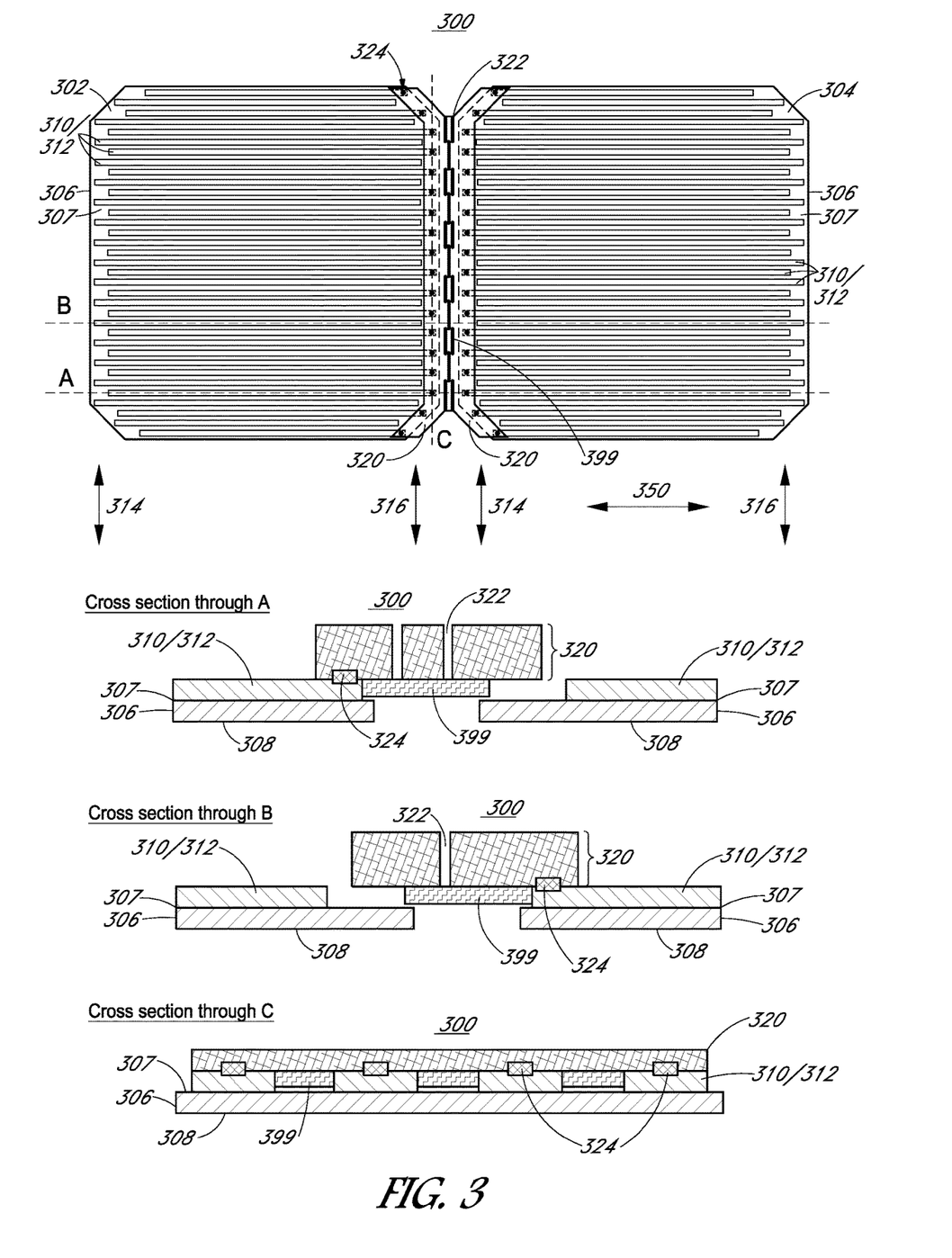
FIG. 3 illustrates a plan view and corresponding cross-sectional views of a photovoltaic assembly based on solar cells of the type of FIG. 1A, in accordance with another embodiment of the present disclosure.

Referring to FIG. 3, a photovoltaic assembly 300 includes first 302 and second 304 solar cells. Each of the first 302 and second 304 solar cells includes a substrate 306 having a back surface 307 and an opposing light-receiving surface 308. Each of the first 302 and second 304 solar cells also includes a plurality of alternating N-type and P-type semiconductor regions 310 disposed in or above the back surface 307 of the substrate 306 and parallel along a first direction 350 to form a one-dimensional layout of emitter regions for the solar cell 302 or 304. Each of the first 302 and second 304 solar cells also includes a conductive contact structure disposed on the plurality of alternating N-type and P-type semiconductor regions 310. The conductive contact structure includes a plurality of metal lines 312 corresponding to the plurality of alternating N-type and P-type semiconductor regions 310 parallel along the first direction 350 to form a one-dimensional layout of a metallization layer for the solar cell. Each of the plurality of metal lines 312 terminates in a staggered fashion at first 314 and second ends 316 of the substrate 306.

The photovoltaic assembly also 300 includes an interconnect structure 320 electrically coupling the first 302 and second 304 solar cells between the second end 316 of the substrate 306 of the first solar cell 304 and the first end 314 of the substrate 306 of the second solar cell 304. The interconnect structure 320 is disposed over and electrically contacts first alternating ones of the plurality of metal lines 312 of the first solar cell 302. However, the interconnect structure is not disposed over second alternating ones of the plurality of metal lines 312 of the first solar cell 302. The interconnect structure 320 is also disposed over and electrically contacts first alternating ones of the plurality of metal lines 312 of the second solar cell 304. However, the interconnect structure 320 is not disposed over second alternating ones of the plurality of metal lines 312 of the second solar cell 304. In an embodiment, from a perspective taken from the light-receiving surface 308, portions of the interconnect structure 320 exposed between the first 302 and second 304 solar cells are covered with a cloaking layer 399. The cloaking layer 399 may be a black polymer material which matches the color of the cells and the black backsheet to provide a uniform black appearance to the finished module. Alternatively, a white backsheet and white cloaking layer can be used to give a uniform white appearance around the perimeter of the cell.

As is depicted in FIG. 3, in an embodiment, the interconnect structure 320 includes one or more stress relief cuts 322 formed therein. As is also depicted in FIG. 3, in an embodiment, the interconnect structure 320 is bonded (e.g., soldered, welded, joined, glued, etc.) to each of the first alternating ones of the plurality of metal lines 312 of the first solar cell 302 and to each of the first alternating ones of the plurality of metal lines 312 of the second solar cell 304 (e.g., as is depicted by bond points 324).

In an implementation of the solar cells of the type of FIG. 1B, and as described in greater detail in association with FIG. 4 below, a cell interconnection geometry can be referred to as a cell interconnection geometry with interlayer dielectric, "with ILD." In such an approach, a plurality of solar cells such as the solar cell of FIG. 1B where fingers may extend as far to the edge of the substrate as needed, are coupled together with a cell interconnect. It is to be appreciated that although there may be a limit imposed by the emitter or BARC coverage at the extreme edges of the substrate, the interconnect extends the full width of the cell, and is bonded on to each finger of the same polarity. The opposite side of the interconnect is bonded to each finger of the opposite polarity on the next cell. By bonding the interconnect individually to each finger, on-cell bussing or pads may be omitted. In an embodiment, the M3 interconnect is fabricated such that a patterned insulating layer prevents shorting. The insulator layer may also be colored so that the interconnect tab is not visible from the front of the module, thus serving two functions. It is also to be appreciated that such an approach may require high accuracy of bonding points between the interconnect (M3) and the on-cell M2, where bond points must be aligned with the M2 fingers. Such a level of accuracy may be achieved using laser welding. In an embodiment, the interconnect is placed and held during bonding with sufficient accuracy such that the exposed bond areas on the interconnect line up with the fingers. The bond points on in the interconnect may need to be pressed (coined) such that they can make intimate contact with the M2 layer on the cell. However, the need for such approaches may depend on the ability of the bond method to bridge gaps or fit-up into gaps.

Figure 4:
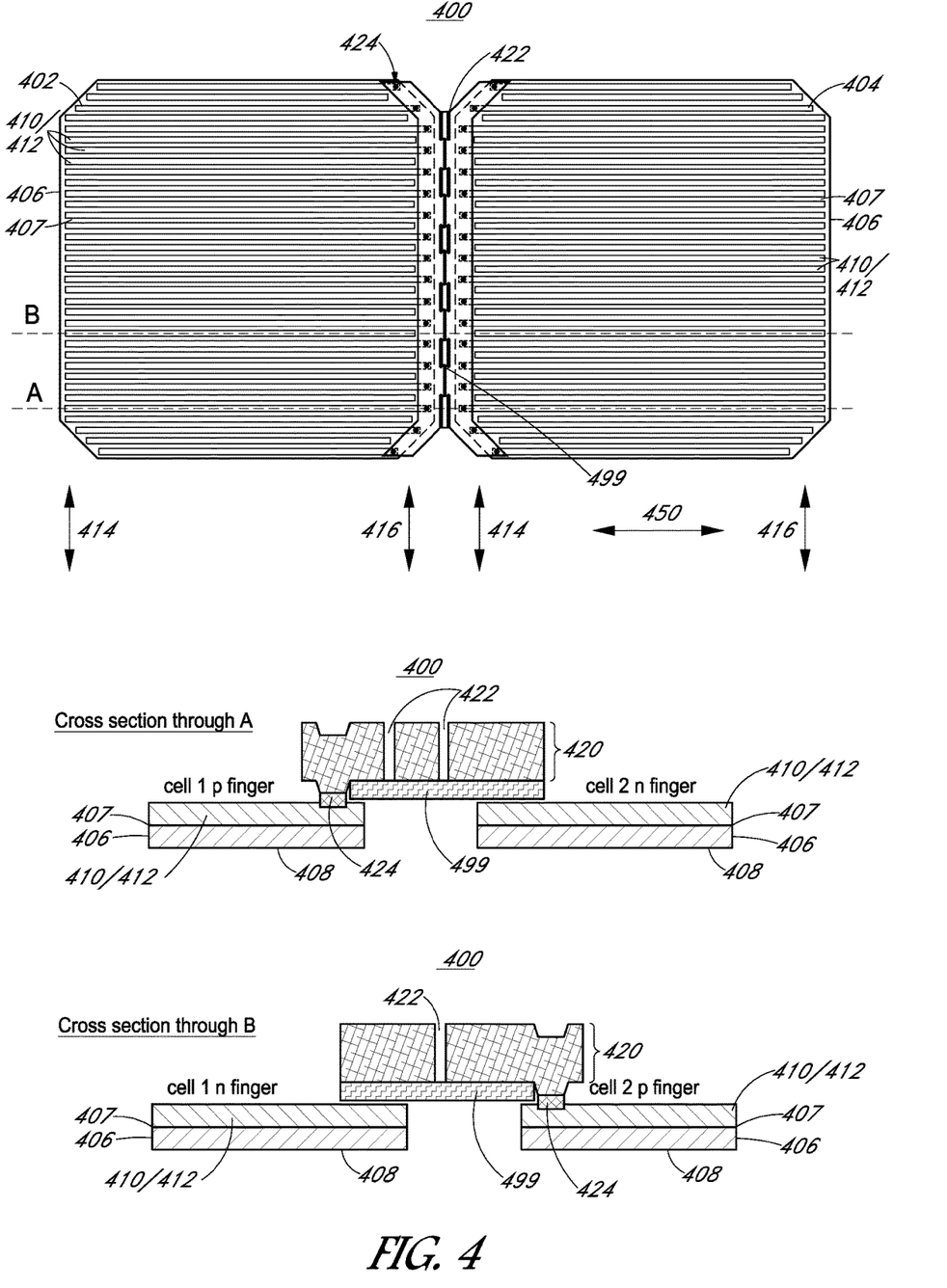
FIG. 4 illustrates a plan view and corresponding cross-sectional views of a photovoltaic assembly based on solar cells of the type of FIG. 1B, in accordance with an embodiment of the present disclosure.

As an example, FIG. 4 illustrates a plan view and corresponding cross-sectional views of a photovoltaic assembly based on solar cells of the type of FIG. 1B, in accordance with an embodiment of the present disclosure. Referring to FIG. 4, a photovoltaic assembly 400 includes first 402 and second 404 solar cells. Each of the first 402 and second 404 solar cells includes a substrate 406 having a back surface 407 and an opposing light-receiving surface 408. Each of the first 402 and second 404 solar cells also includes a plurality of alternating N-type and P-type semiconductor regions 410 disposed in or above the back surface 407 of the substrate 406 and parallel along a first direction 450 to form a one-dimensional layout of emitter regions for the solar cell 402 or 404. Each of the first 402 and second 404 solar cells includes a conductive contact structure disposed on the plurality of alternating N-type and P-type semiconductor regions 410. The conductive contact structure includes a plurality of metal lines 412 corresponding to the plurality of alternating N-type and P-type semiconductor regions 410, and parallel along the first direction 450 to form a one-dimensional layout of a metallization layer for the solar cell 402 or 404. Each of the plurality of metal lines 412 terminates in a parallel fashion at first 414 and second 416 ends of the substrate.

The photovoltaic assembly 400 also includes an interconnect structure 420 electrically coupling the first 402 and second 404 solar cells between the second end 416 of the substrate 406 of the first solar cell 402 and the first end 414 of the substrate 406 of the second solar cell 404. The interconnect structure 420 is disposed over and electrically contacts first alternating ones of the plurality of metal lines 412 of each of the first 402 and second 404 solar cells. The interconnect structure 420 is also disposed over, but is not electrically contacting, second alternating ones of the plurality of metal lines 412 of each of the first 402 and second 404 solar cells.

Referring again to FIG. 4, in an embodiment, an insulating layer 499 blocks electrical contact of the interconnect structure 420 to the second alternating ones of the plurality of metal lines 412 of each of the first 402 and second 404 solar cells. In a particular such embodiment, from a perspective taken from the light-receiving surface 408, portions of the interconnect structure 420 exposed between the first 402 and second 404 solar cells are cloaked by the insulating layer 499, as is depicted in FIG. 4. In an embodiment, the interconnect structure 420 includes one or more stress relief cuts 422 formed therein. In an embodiment, the interconnect structure 420 is bonded (e.g., soldered, welded, joined, glued, etc.) to each of the first alternating ones of the plurality of metal lines 412 of each of the first 402 and second 404 solar cells (e.g., as is depicted by bond points 424).

Figure 5A:
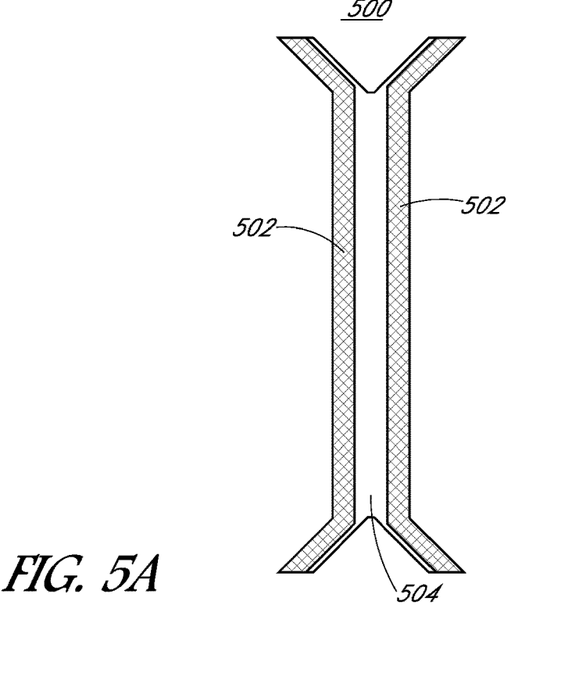
FIG. 5A illustrates a plan view from a light-receiving surface of a photovoltaic assembly of the type of FIG. 3, in accordance with an embodiment of the present disclosure.

It is to be appreciated that the appearance of an interconnect structure when viewed from a light-receiving surface of a photo-voltaic module can vary depending on the implementation. In a first example, FIG. 5A illustrates a plan view from a light-receiving surface of a photovoltaic assembly of the type of FIG. 3, in accordance with an embodiment of the present disclosure. Referring to FIG. 5A, an interconnect structure 500 includes metal interconnect portions 502 for bonding to adjacent solar cells. An insulating layer and/or cloaking layer 504 masks exposure of the portion of the interconnect structure 500 between the adjacent solar cells.

Figure 5B:
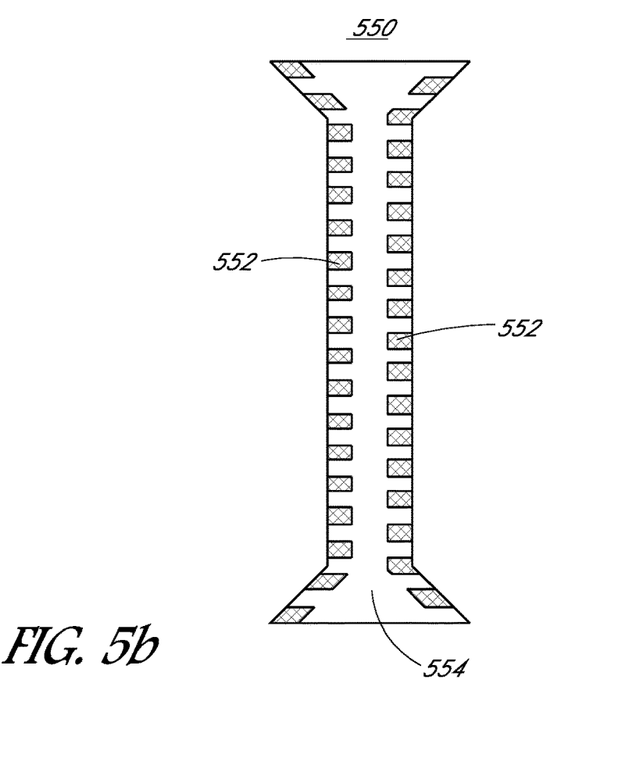
FIG. 5B illustrates a plan view from a light-receiving surface of a photovoltaic assembly of the type of FIG. 4, in accordance with an embodiment of the present disclosure.

In a second example, FIG. 5B illustrates a plan view from a light-receiving surface of a photovoltaic assembly of the type of FIG. 4, in accordance with an embodiment of the present disclosure. Referring to FIG. 5B, an interconnect structure 550 includes metal interconnect portions 552 for bonding to adjacent solar cells. An insulating layer and/or cloaking layer 554 masks exposure of the portion of the interconnect structure 550 between the adjacent solar cells.

In an embodiment, alternating N-type and P-type semiconductor regions described herein are formed from polycrystalline silicon. In one such embodiment, the N-type polycrystalline silicon emitter regions are doped with an N-type impurity, such as phosphorus. The P-type polycrystalline silicon emitter regions are doped with a P-type impurity, such as boron. The alternating N-type and P-type semiconductor regions may have trenches formed there between, the trenches extending partially into the substrate. Additionally, although not depicted, in one embodiment, a bottom anti-reflective coating (BARC) material or other protective layer (such as a layer amorphous silicon) may be formed on the alternating N-type and P-type semiconductor regions. The alternating N-type and P-type semiconductor regions may be formed on a thin dielectric tunneling layer formed on the back surface of the substrate.

In an embodiment, a light receiving surface of a solar cell described herein may be a texturized light-receiving surface. In one embodiment, a hydroxide-based wet etchant is employed to texturize the light receiving surface of the substrate. In an embodiment, a texturized surface may be one which has a regular or an irregular shaped surface for scattering incoming light, decreasing the amount of light reflected off of the light receiving surface of the solar cell. Additional embodiments can include formation of a passivation and/or anti-reflective coating (ARC) layers on the light-receiving surface.

In an embodiment, an M1 layer, if included, is a plurality of metal seed material regions. In a particular such embodiment, the metal seed material regions are aluminum regions each having a thickness approximately in the range of 0.3 to 20 microns and composed of aluminum in an amount greater than approximately 97% and silicon in an amount approximately in the range of 0-2%.

In an embodiment, an M2 layer as described herein is a conductive layer formed through electroplating or electroless plating. In another embodiment, an M2 layer as described herein is a metal foil layer. In one such embodiment, the metal foil is an aluminum (Al) foil having a thickness approximately in the range of 5-100 microns and, preferably, a thickness approximately in the range of 30-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In another embodiment, a copper foil, or a copper layer supported on a carrier, is used the "metal foil." In some embodiments, a protective layer such as a zincate layer is included on one or both sides of the metal foil.

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, approaches for fabricating one-dimensional metallization for solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
    a plurality of semiconductor regions disposed in or above a substrate, the substrate comprising a first end and a second end;
    a conductive contact structure comprising a first plurality of metal lines and a second plurality of metal lines disposed on the plurality of semiconductor regions, wherein the first plurality of metal lines and the second plurality of metal lines terminate in a staggered fashion at the first and second ends of the substrate, and wherein the staggered fashion comprises alternating long terminations of the first plurality of metal lines along a first direction relative to short terminations of the second plurality of metal lines along the first direction for neighboring ones of the first and second pluralities of metal lines, and wherein the metal lines of the first plurality of metal lines that have long terminations are discontinuous from one another, and the metal lines of the second plurality of metal lines that have short terminations are discontinuous from one another, and wherein the staggered fashion conforms to angled corners of the substrate including alternating long terminations of the first plurality of metal lines along the first direction relative to short terminations of the second plurality of metal lines along the first direction for neighboring ones of the first and second pluralities of metal lines along the angled corners;
    an interconnect structure located over the second end of the substrate, the interconnect structure disposed over and electrically contacting portions of the first plurality of metal lines but not disposed over the second plurality of metal lines, wherein the interconnect structure extends along the second end for a full width of the solar cell and comprises an extension portion comprising two edges parallel to one of the angled corners of the substrate, and wherein the interconnect structure has one or more cuts there through; and
    bond points disposed between the portions of the first plurality of metal lines and the interconnect structure.

2. The solar cell of claim 1, wherein the bond points comprise a bond point selected from the group consisting of a soldered, welded, and glued point.

3. The solar cell of claim 1, wherein the conductive contact structure further comprises a metal seed layer disposed between the plurality of semiconductor regions and the first and second plurality of metal lines.

4. The solar cell of claim 1, wherein each of the first and second plurality of metal lines comprises a metal foil.

5. A photovoltaic assembly, comprising first and second solar cells, each of the first and second solar cells comprising:
    a plurality of semiconductor regions disposed in or above a substrate, the substrate comprising a first end and a second end;
    a conductive contact structure comprising a first plurality of metal lines and a second plurality of metal lines disposed on the plurality of semiconductor regions, wherein the first plurality of metal lines and the second plurality of metal lines terminate in a staggered fashion at the first and second ends of the substrate, and wherein the staggered fashion comprises alternating long terminations of the first plurality of metal lines along a first direction relative to short terminations of the second plurality of metal lines along the first direction for neighboring ones of the first and second pluralities of metal lines, and wherein the metal lines of the first plurality of metal lines that have long terminations are discontinuous from one another, and the metal lines of the second plurality of metal lines that have short terminations are discontinuous from one another, and wherein the staggered fashion conforms to angled corners of the substrate including alternating long terminations of the first plurality of metal lines along the first direction relative to short terminations of the second plurality of metal lines along the first direction for neighboring ones of the first and second pluralities of metal lines along the angled corners;
    an interconnect structure electrically coupling the first and second solar cells between the second end of the substrate of the first solar cell and the first end of the substrate of the second solar cell, the interconnect structure disposed over and electrically contacting portions of the first plurality of metal lines of the first solar cell but not disposed over the second plurality of metal lines of the first solar cell, and the interconnect structure disposed over and electrically contacting portions of the first plurality of metal lines of the second solar cell but not disposed over the second plurality of metal lines of the second solar cell, wherein the interconnect structure extends along the second end of the first solar cell for a full width of the first solar cell and comprises an extension portion comprising two edges parallel to one of the angled corners of the substrate of the first solar cell, and wherein the interconnect structure has one or more cuts there through; and bond points disposed between the portions of the first plurality of metal lines of the first and second solar cells and the interconnect structure.

6. The photovoltaic assembly of claim 5, wherein the bond points comprise a bond point selected from the group consisting of a soldered, welded, and glued point.

7. The photovoltaic assembly of claim 5, wherein, from a perspective taken from the light-receiving surface, portions of the interconnect structure exposed between the first and second solar cells are covered with a cloaking layer.

8. The photovoltaic assembly of claim 5, wherein the conductive contact structure of each of the first and second solar cells further comprises a metal seed layer disposed between the plurality of semiconductor regions and the first and second plurality of metal lines of the first and second solar cells.

9. The photovoltaic assembly of claim 5, wherein, for each of the first and second solar cells, the substrate is a monocrystalline silicon substrate, and the plurality of semiconductor regions is a plurality of N-type and P-type polycrystalline silicon regions formed above the substrate.

10. The photovoltaic assembly of claim 5, wherein, for each of the first and second solar cells, each of the first and second plurality of metal lines comprises a metal foil.

11. A solar cell, comprising:
a plurality of semiconductor regions disposed in or above a substrate, the substrate comprising a first end and second end;
a conductive contact structure comprising a first plurality of metal lines and a second plurality of metal lines disposed on the plurality of semiconductor regions, wherein the first plurality of metal lines and the second plurality of metal lines terminate in a staggered fashion at the first and second ends of the substrate, and wherein the staggered fashion comprises alternating long terminations of the first plurality of metal lines along a first direction relative to short terminations of the second plurality of metal lines along the first direction for neighboring ones of the first and second pluralities of metal lines, and wherein the metal lines of the first plurality of metal lines that have long terminations are discontinuous from one another, and the metal lines of the second plurality of metal lines that have short terminations are discontinuous from one another, and wherein the staggered fashion conforms to angled corners of the substrate including alternating long terminations of the first plurality of metal lines along the first direction relative to short terminations of the second plurality of metal lines along the first direction for neighboring ones of the first and second pluralities of metal lines along the angled corners;

an interconnect structure located over the second end of the substrate, the interconnect structure disposed over portions of the first and second plurality of metal lines but not electrically contacting the second plurality of metal lines, wherein the interconnect structure extends along the second end for a full width of the solar cell and comprises an extension portion comprising two edges parallel to one of the angled corners of the substrate, and wherein the interconnect structure has one or more cuts there through; and bond points disposed between the portions of the first plurality of metal lines and the interconnect structure.

12. The solar cell of claim 11, wherein an insulating layer blocks electrical contact of the interconnect structure to the second plurality of metal lines.

13. The solar cell of claim 11, wherein the bond points comprise a bond point selected from the group consisting of a soldered, welded, and glued point.

14. The solar cell of claim 11, wherein each of the first and second plurality of metal lines comprises a metal foil.

15. The solar cell of claim 1, wherein the second end includes a chamfered corner.

16. The solar cell of claim 1, wherein the second end connects two opposing top-to-bottom edges that extend in a length direction of the solar cell.

* * * * *